(12) United States Patent
Shintani et al.

(10) Patent No.: US 7,274,542 B2
(45) Date of Patent: Sep. 25, 2007

(54) MAGNETIC SENSOR HAVING A FREE LAYER CONTAINING A SINGLE MAGNETIC DOMAIN

(75) Inventors: Taku Shintani, Odawara (JP); Katsuro Watanabe, Odawara (JP); Masahiko Hatatani, Odawara (JP); Kikuo Kusukawa, Yoshikawa (JP)

(73) Assignee: Hitachi Global Storage Technologies Japan, Ltd., Odawara-shi (JP)

( * ) Notice: Subject to any disclaimer, the term of this patent is extended or adjusted under 35 U.S.C. 154(b) by 788 days.

(21) Appl. No.: 10/358,179

(22) Filed: Feb. 5, 2003

(65) Prior Publication Data

US 2004/0080873 A1    Apr. 29, 2004

(30) Foreign Application Priority Data

Oct. 29, 2002    (JP)    ............................. 2002-313622

(51) Int. Cl.
G11B 5/39    (2006.01)
(52) U.S. Cl. .............. 360/324.1; 360/324; 360/324.11; 360/324.12
(58) Field of Classification Search ...................... None
See application file for complete search history.

(56) References Cited

U.S. PATENT DOCUMENTS 5,729,410 A    3/1998   Fontana, Jr.
5,898,548 A *  4/1999   Dill et al. ................. 360/324.2
6,381,094 B1 * 4/2002   Gill ............................ 360/126
6,839,205 B2 * 1/2005   Kagami et al. ........... 360/324.1
6,950,290 B2 * 9/2005   Hayashi et al. ........... 360/324.1
2003/0039080 A1 * 2/2003 Kagami et al. ........... 360/324.1

FOREIGN PATENT DOCUMENTS

| JP | A-10-162327 | 6/1998 |
|---|---|---|
| JP | 11175928 | 7/1999 |
| JP | 2001-6130 | 1/2001 |

* cited by examiner

Primary Examiner—Angel Castro
Assistant Examiner—Christopher R. Magee
(74) Attorney, Agent, or Firm—Antonelli, Terry, Stout & Kraus, LLP.

(57) ABSTRACT

A magnetic sensor includes a spacer having at least a nonmagnetic metal layer inserted between the upper shield layer and the longitudinal bias layers or between the upper shield layer and the longitudinal bias layers plus the magnetoresistive film, the shortest distance between the longitudinal bias layers and the free layer of the magnetoresistive film is set smaller than the shortest distance between the longitudinal bias layers and the upper shield layer, and this arrangement ensures that the amount of magnetic flux entering the magnetoresistive film from the longitudinal bias layers is larger than that absorbed by the upper shield layer, thus realizing a magnetic sensor whose Barkhausen noise is suppressed.

10 Claims, 11 Drawing Sheets

MAGNETIC SENSOR HAVING A FREE LAYER CONTAINING A SINGLE MAGNETIC DOMAIN

BACKGROUND OF THE INVENTION

1. Field of the Invention

The present invention relates to a magnetic sensor for reading magnetically recorded information, a method of manufacture thereof and a magnetic storage incorporating the magnetic sensor.

2. Description of the Related Art

A magnetic sensor making use of magnetoresistance which changes an electric resistance in response to an external magnetic field, has been known as an excellent magnetic field sensor and already put to practical use as a reading element for detecting a signal magnetic field from a magnetic recording medium as a main component of a magnetic storage.

Magnetic storage technology is continuing to make significant improvements in their recording density. To achieve higher recording density, there are growing demands on magnetic heads for a narrow track width and higher read/write performances. As for the read characteristic, efforts are made to enhance a sensitivity of the head by advancing an MR head technology that utilizes the magnetoresistance. At a low a real density of several gigabits per square inch (Gb/in$^2$), magnetic signals on recording media have been converted into electric signals by utilizing an anisotropic magnetoresistance (AMR). At higher a real densities a more sensitive giant magnetoresistance (GMR) is employed.

To meet the demand for even higher recording density, research and development are being conducted on a reading element which utilizes a GMR (CPP-GMR), the GMR that causes a sensing current to flow perpendicular to a layer plane, and a tunneling magnetoresistance (TMR). Both of these technologies are advantageous in increasing the sensitivity of the reading element as a distance between an upper shield layer and a lower shield layer (shield-to-shield distance) decreases.

When Barkhausen noise occurs, an S/N loss of the reading element increases and thus the Barkhausen noise needs to be minimized. The Barkhausen noise is produced by microscopic movements of domain walls and it is important to use a longitudinal bias layer that causes a free layer of a magnetoresistive multilayer film to have a single magnetic domain. This longitudinal bias layer is often arranged at both ends of the reading element in a track width direction when seen from the opposing recording media side.

The longitudinal bias layer is normally made from a hard magnetic material formed on an appropriate metallic underlayer. In the reading element described above in which a sensing current flows perpendicular to the layer plane, it is necessary to prevent a leakage of the sensing current as it flows through the longitudinal bias layer and also an output reduction caused by the leakage.

For example, JP-A-10-162327 discloses a structure in which an insulating layer is provided between the longitudinal bias layer and a magnetoresistive multilayer film, between the longitudinal bias layer and an upper shield layer, and between the longitudinal bias layer and a lower shield layer to prevent the leakage.

Further, JP-A-2001-6130 discloses a tunneling magnetoresistive head which has a nonmagnetic, conductive gap layer between the magnetoresistive multilayer film and the shields to eliminate a nonuniformity of the tunneling current.

As described above, the longitudinal bias layer is aimed at minimizing the Barkhausen noise by applying a magnetic field to a free layer of the magnetoresistive multilayer film to establish a single magnetic domain in the free layer. The lower shield layer and the upper shield layer are intended to absorb stray magnetic fields from neighboring bits or external fields so that information stored on the recording media can be read out correctly by the magnetoresistive multilayer film. Thus, the magnetoresistive multilayer film can detect a magnetic field of every bit recorded on the media.

When the head is actually manufactured, however, the distance between a longitudinal bias layer 1 and an upper shield layer 4 is smaller, as shown in FIG. 1, than that between the longitudinal bias layer 1 and a free layer 7 of the magnetoresistive multilayer film 2. This is attributed to the fact that, when a structure consisting of insulating layer 5/longitudinal bias layer 1/second insulating layer 6 is formed by the lift-off method at both ends of the magnetoresistive multilayer film 2, it is difficult for the second insulating layer 6 over the longitudinal bias layer 1 to have a sufficient thickness in the vicinity of the magnetoresistive multilayer film 2 because a width and an undercut length of a lift-off pattern are too small.

Because the longitudinal bias layer 1 is closer to the upper shield layer 4 than the magnetoresistive multilayer film 2, the amount of magnetic flux from the longitudinal bias layer 1 that is absorbed by the upper shield layer 4 is larger than that entering the free layer 7 of the magnetoresistive multilayer film 2. This in turn causes Barkhausen noise.

SUMMARY OF THE INVENTION

An object of the present invention is to provide a magnetic sensor that eliminates the aforementioned problems during the manufacturing process and that reliably applies a magnetic field from the longitudinal bias layer to the free layer of the magnetoresistive film so that the free layer has a single magnetic domain, thus suppressing Barkhausen noise and assuring an excellent stability. The present invention also provides a magnetic storage incorporating the magnetic sensor.

To achieve the above objective, one aspect of the present invention provides a magnetic sensor comprising: a pair of lower and upper shield layers; a magnetoresistive film disposed between the pair of shield layers and having a laminated multilayer structure made up of a free layer, an intermediate layer and a pinned layer; and a pair of longitudinal bias layers disposed at both ends of the magnetoresistive film in a track width direction; wherein a sensing current is made to flow in a direction of thickness of the magnetoresistive film and a spacer including at least a nonmagnetic metal layer is disposed between the upper shield layer and the longitudinal bias layers.

More specifically, the magnetic sensor is characterized in that a spacer including at least a nonmagnetic metal layer is formed between the upper shield layer and the longitudinal bias layers and that a shortest distance between the longitudinal bias layers and the free layer of the magnetoresistive film is smaller than a shortest distance between the longitudinal bias layers and the upper shield layer.

Further, the magnetic sensor is characterized in that a shortest distance between the longitudinal bias layers and the free layer of the magnetoresistive film is smaller than a shortest distance between the longitudinal bias layers and the upper shield layer.

This arrangement avoids the problems of the lift-off pattern width and the undercut length described above and makes it easy to set the distance between the longitudinal bias layers and the upper shield layer larger than the distance between the longitudinal bias layers and the free layer of the magnetoresistive film. This in turn ensures that the amount of magnetic flux entering the free layer of the magnetoresistive film from the longitudinal bias layers is larger than the amount of flux absorbed by the upper shield layer. As a result, Barkhausen noise can be suppressed and a stable magnetic sensor realized.

Other objects, features and advantages of the invention will become apparent from the following description of the embodiments of the invention taken in conjunction with the accompanying drawings.

DETAILED DESCRIPTION OF THE EMBODIMENTS

Figure 2:
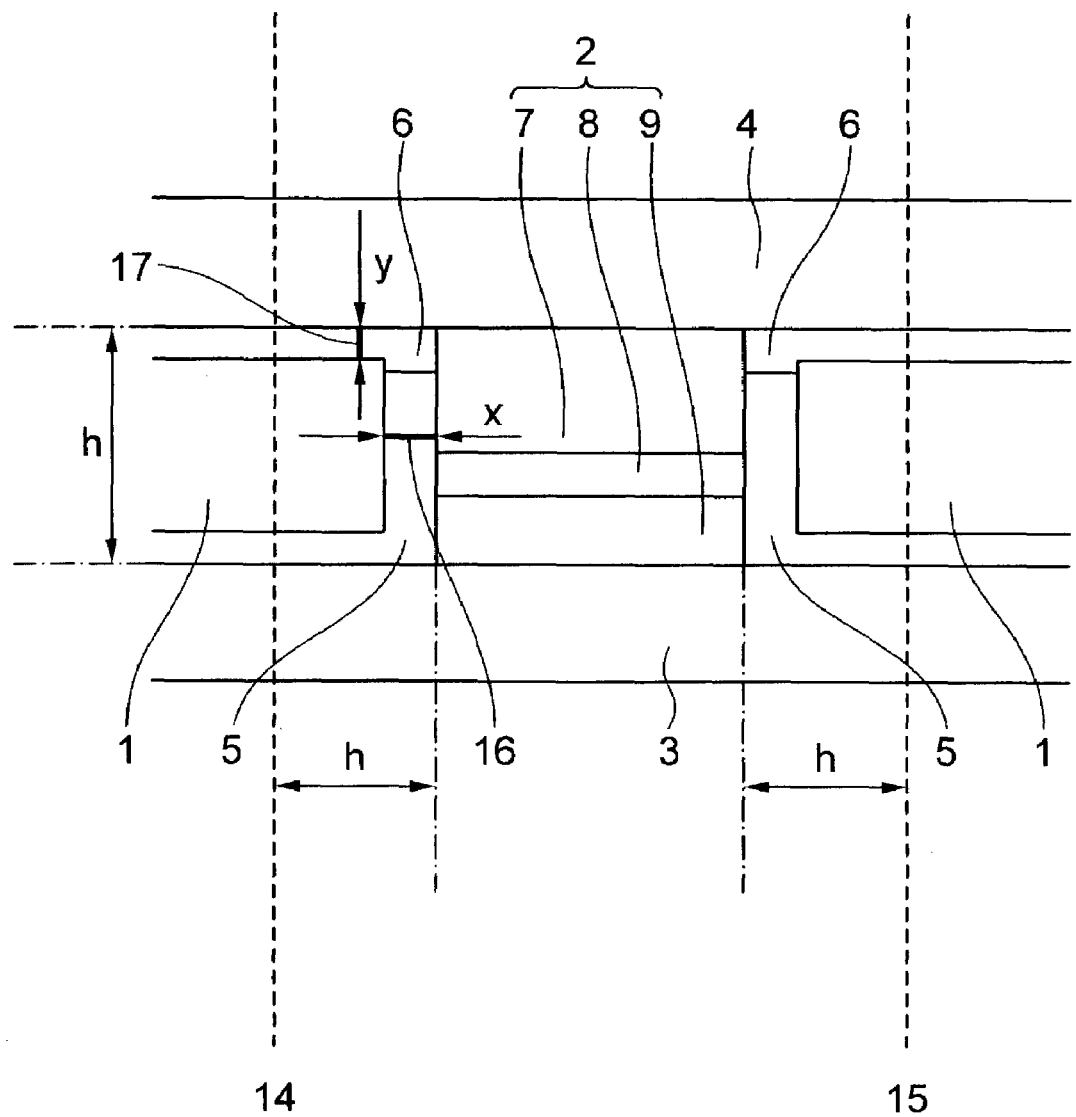
FIG. 2 is a schematic diagram showing a magnetic sensor as a calculation model examined in the present invention.

First, using a simplified model, an effect of inserting a spacing layer or spacer was examined by calculation. The calculation model of a magnetic sensor used is shown in FIG. 2. In this calculation a distance between an upper shield layer 4 and a lower shield layer 3, between which a magnetoresistive film 2 is sandwiched, is defined as a shield-to-shield distance h, a thickness of a longitudinal bias layer 1 is set to 30 nm, and a distance between the longitudinal bias layer 1 and the lower shield layer 3 is set to 15 nm. It is assumed that the longitudinal bias layer 1 has a magnetic flux density of 1.0 T.

Figure 3:
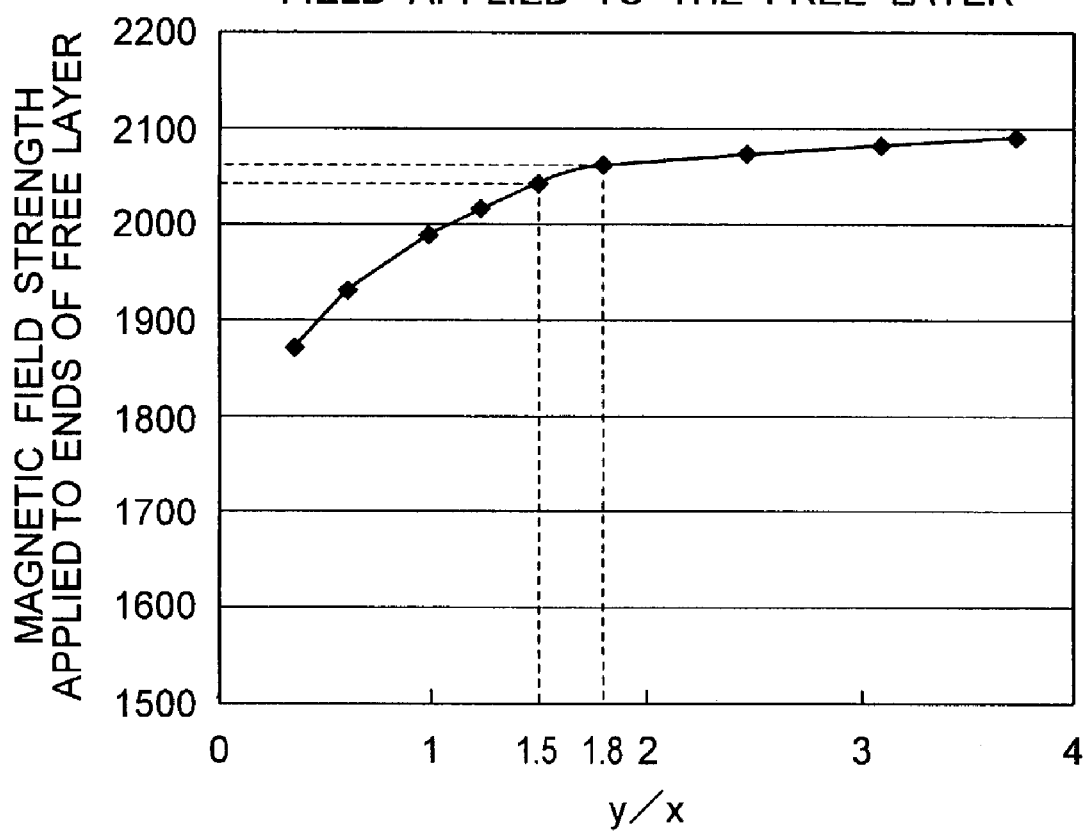
FIG. 3 is a characteristic diagram showing a relation between y/x and a strength of a magnetic field applied to ends of a free layer.

First, the distance between the upper shield layer 4 and the lower shield layer 3, between which the magnetoresistive film 2 is sandwiched, is set to the shield-to-shield distance h. Next, in a region including the magnetoresistive film 2 plus the shield-to-shield distances h on both sides of the magnetoresistive film 2 in the track width direction, i.e., in a region defined by imaginary lines 14 and 15, a shortest line segment connecting the longitudinal bias layer 1 and the free layer 7 of the magnetoresistive film 2 is taken as x and a shortest line segment connecting the longitudinal bias layer 1 and the upper shield layer 4 is taken as y. Then, the strength of a magnetic field at the ends of the free layer 7 is calculated in relation to y/x, with x fixed and y taken as a parameter. This is shown in FIG. 3. To suppress Barkhausen noise normally requires applying a magnetic field strength of approximately 2,000 Oe to the free layer 7 of the magnetoresistive film 2. It follows from FIG. 3 that the value of y/x needs to be at least 1 to meet this level of field strength.

Next, embodiments of the present invention will be described by referring to the accompanying drawings.

Embodiment 1

Figure 4:
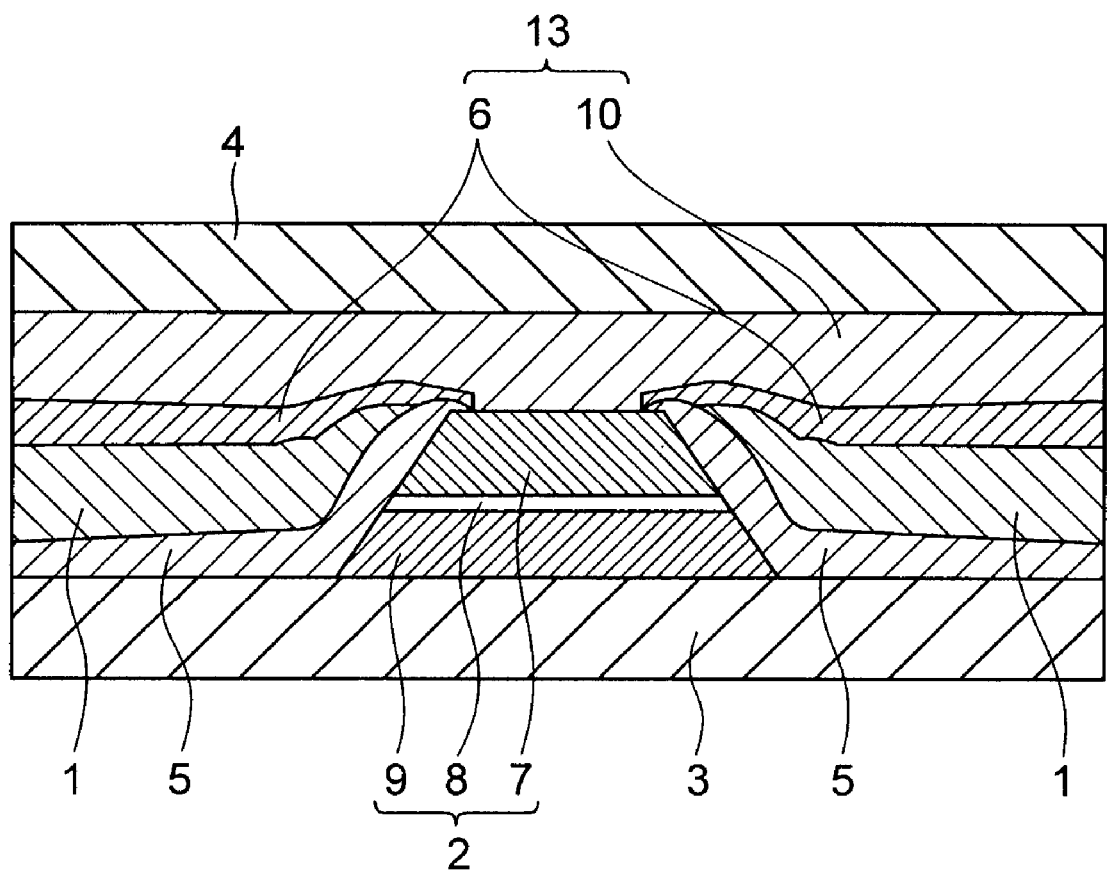
FIG. 4 is a cross-sectional view of a magnetic sensor according to Embodiment 1 of the present invention.
Figure 5A:
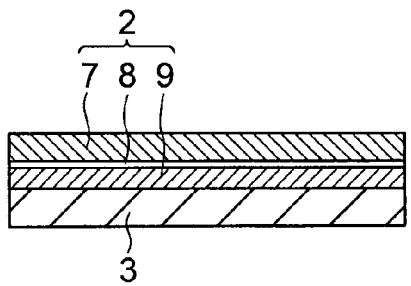
FIGS. 5A to 5H are schematic diagrams showing a method of manufacturing the magnetic sensor of Embodiment 1 of the present invention.
Figure 5B:
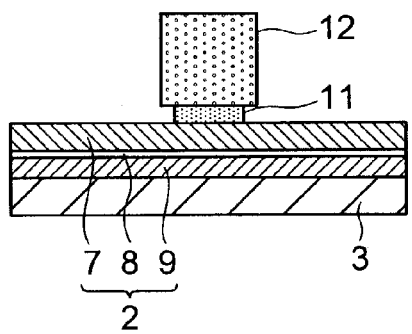
Figure 5C:
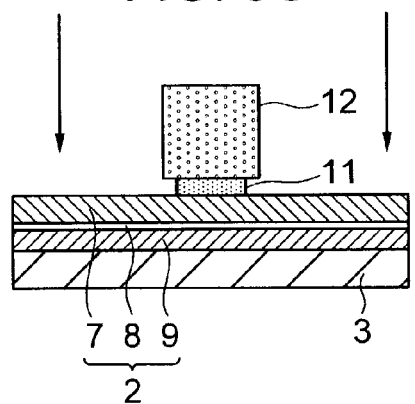
Figure 5D:
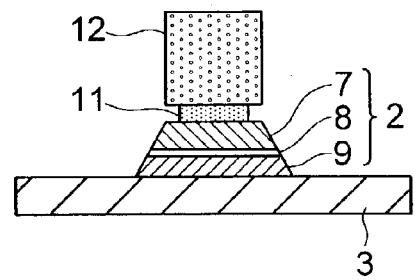
Figure 5E:
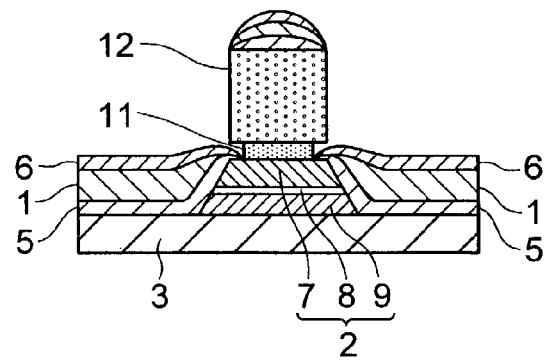
Figure 5F:
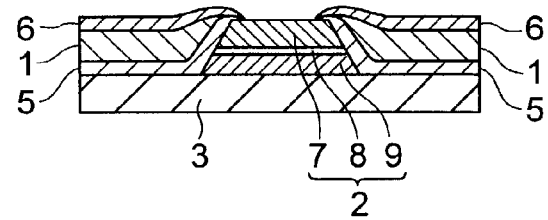
Figure 5G:
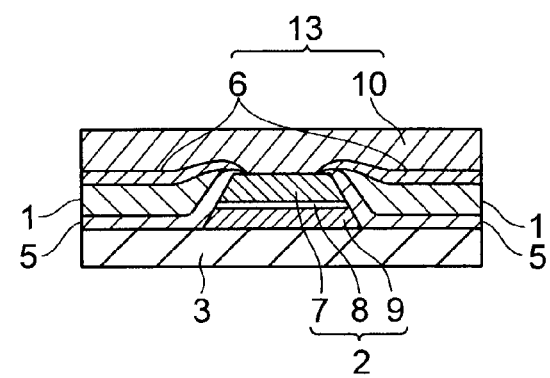
Figure 5H:
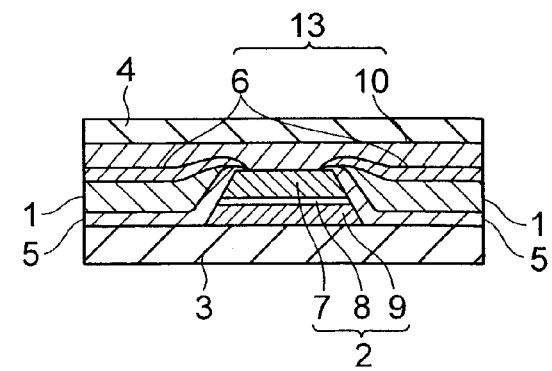
Figure 6:
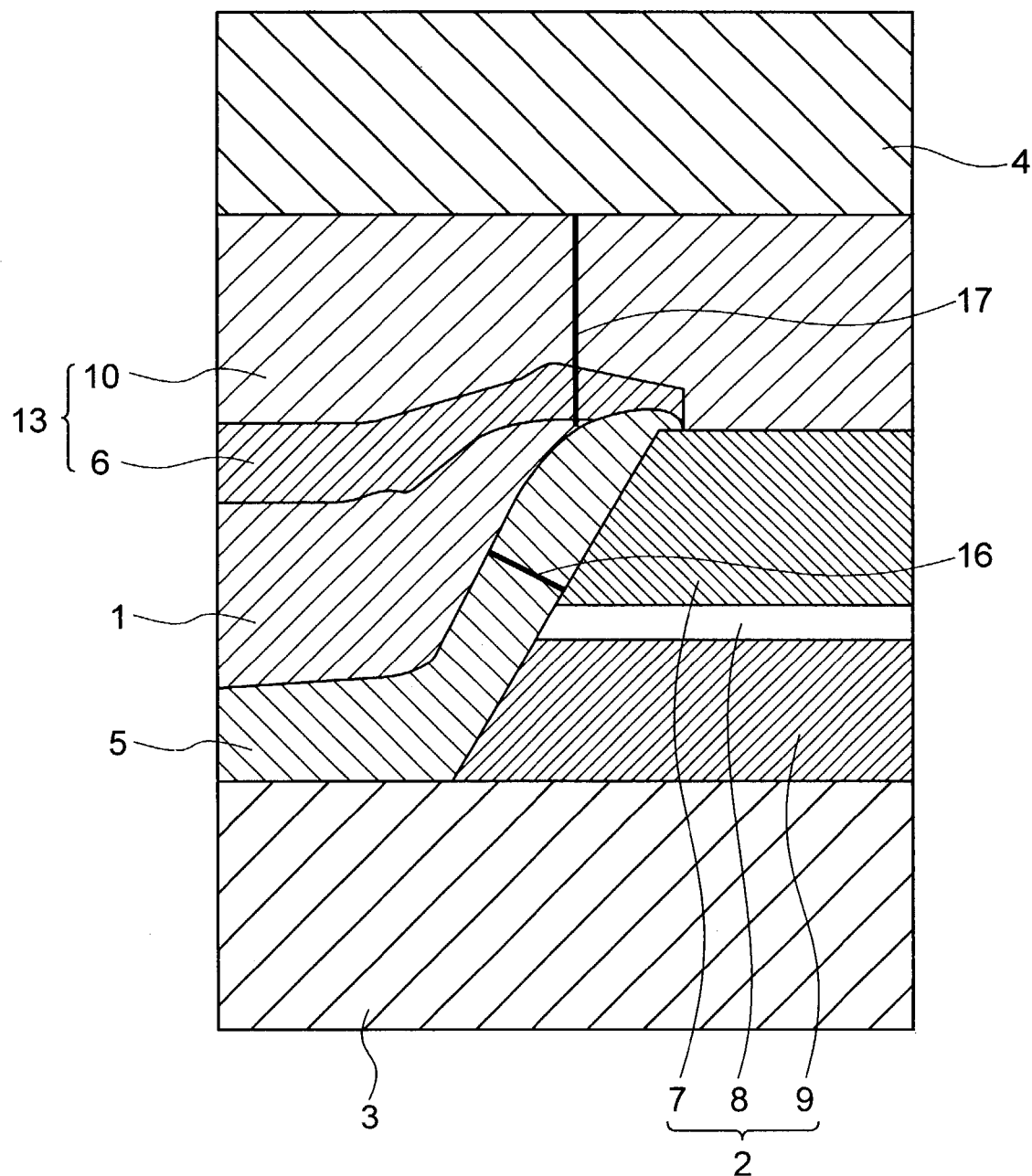
FIG. 6 is a schematic diagram showing a magnetoresistive film of the magnetic sensor and surrounding portions thereof in Embodiment 1 of the present invention.

As one embodiment of this invention, FIG. 4 shows a cross-sectional structure of the magnetic sensor taken along the line of the track width direction, FIG. 5 shows a method of manufacturing the magnetic sensor, and FIG. 6 shows an enlarged view of a track-width-direction end portion of the magnetoresistive film 2 of FIG. 4.

An insulating material such as alumina is deposited over the surface of a substrate, which is then subjected to a precision polishing such as a chemical mechanical polishing (CMP). After this, a lower shield layer 3 is formed over the substrate, for example, by ion-milling, through a resist mask of a desired pattern, a Ni—Fe alloy film deposited by sputtering, ion beam sputtering or plating, and then removing the resist.

Over this substrate $Al_2O_3$ is grown to fill those portions removed by ion milling. This is subjected to CMP. As a result, the substrate surface formed of the lower shield layer 3 and $Al_2O_3$ is planarized. Further, a readout electrode layer (not shown) is formed at locations remote from the sensor. The electrode layer may, for example, be made of Ta, Au and Ta.

Over this lower shield layer 3 a film of the magnetoresistive film 2 is formed as by sputtering or ion beam sputtering (FIG. 5A). A signal detection current (sensing current) is made to flow perpendicular to the plane of the magnetoresistive film 2 (CCP: Current Perpendicular to the Plane). This magnetoresistive film 2 examined uses a TMR structure.

The TMR film comprises, for example, a pinned layer 9 containing a Co—Fe alloy ferromagnetic substance, an intermediate layer 8 of $Al_2O_3$, and a free layer 7 containing Ni—Fe and Co—Fe alloys.

Next, a lift-off mask, made up of a polydimethyl glutarimide (hereinafter referred to as PMGI) 11 as a lower layer and a resist 12 as an upper layer, is deposited over the film of the magnetoresistive film 2, exposed by an aligner and then developed using a developer to be patterned into a desired shape (FIG. 5B). Then, as shown in FIG. 5C, with the patterned PMGI 11 and resist 12 as a mask, the film of magnetoresistive film 2 is subjected to dry etching, such as ion beam etching and reactive ion etching (RIE), to form a patterned magnetoresistive film 2 as shown in FIG. 5D.

Next, an insulating layer 5 of insulating substance such as $Al_2O_3$ or $SiO_2$, a longitudinal bias layer 1 of magnetic material such as CoCrPt, and a second insulating layer 6 of insulating substance such as $Al_2O_3$ or $SiO_2$ are deposited successively as by sputtering and ion beam sputtering (FIG. 5E).

Next, an organic solvent is used to melt away the lift-off mask made up of the patterned PMGI 11 and resist 12, together with the insulating layer 5/longitudinal bias layer 1/second insulating layer 6 formed on the resist 12, to form a structure in which the longitudinal bias layer 1 is arranged at both ends of the magnetoresistive film 2 with the insulating layer 5 therebetween (FIG. 5F).

After this, a nonmagnetic layer 10 is deposited by sputtering or ion beam sputtering (FIG. 5G). The nonmagnetic layer 10 uses such nonmagnetic metals as NiCr and Ru.

Next, an upper shield layer 4 of NiFe is formed as by sputtering, ion beam sputtering or plating (FIG. 5H).

In FIG. 6, the length of a shortest line segment connecting the longitudinal bias layer 1 and the free layer 7 of the magnetoresistive film 2 is denoted x and the length of a shortest line segment connecting the longitudinal bias layer 1 and the upper shield layer 4 is denoted y. If a distance between the upper shield layer 4 and the lower shield layer 3, between which the magnetoresistive film 2 is sandwiched, is taken as a shield-to-shield distance h, it is assumed that, in a region covering the shield-to-shield distances h added to the magnetoresistive film 2 on each side thereof in the track width direction, the thickness of the thinnest portion of a spacer 13 is equal to y.

In the region described above, the thickness of the thinnest portion of the spacer 13, y, needs to be set equal to or larger than x, the length of the shortest line segment 16 connecting the longitudinal bias layer 1 and the free layer 7 of the magnetoresistive film 2.

In the magnetic sensor fabricated according to this embodiment, the shortest line segment 16 connecting the longitudinal bias layer 1 and the free layer 7 of the magnetoresistive film 2 is found to have a length x of 8 nm and the shortest line segment 17 connecting the longitudinal bias layer 1 and the upper shield layer 4, i.e., the thickness y of the thinnest portion of the spacer 13 in the above-described region, is found to be 16 nm.

Figure 1:
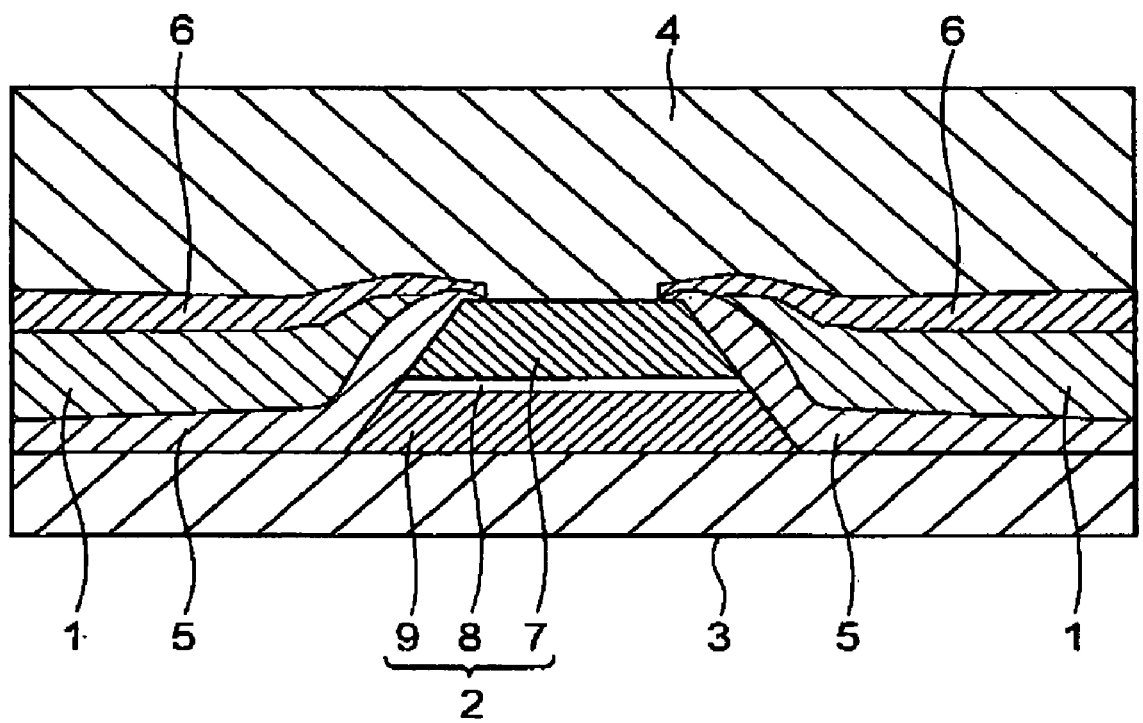
FIG. 1 is a cross-sectional view of a magnetic sensor with a conventional CPP structure.

Of 100 magnetic sensors manufactured as described above, 95 sensors were found good, producing no Barkhausen noise. In contrast, when the magnetic sensors were manufactured in the conventional structure as shown in FIG. 1, only 13 out of 100 sensors did not produce Barkhausen noise. It follows therefore that the magnetic sensor according to this invention has an ability to restrain Barkhausen noise.

Figure 7:
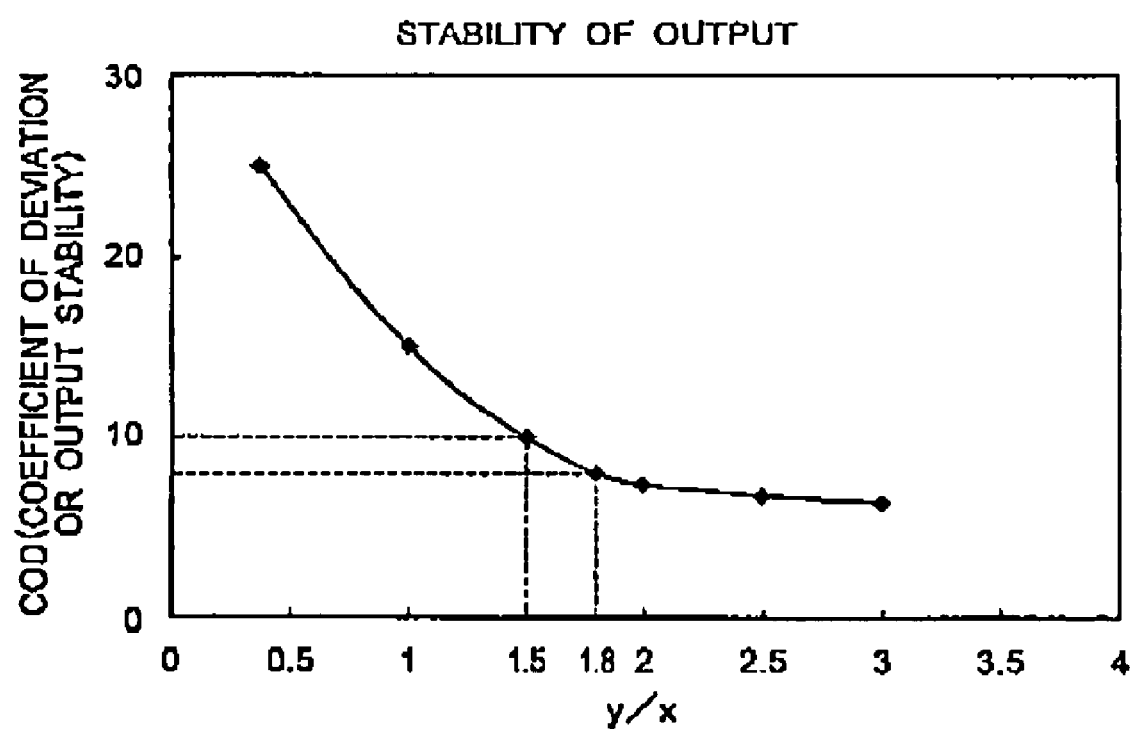
FIG. 7 is a characteristic diagram showing a relation between y/x and COD.

Outputs of the manufactured magnetic sensors were measured to examine their stability. FIG. 7 shows a result of measurements of a COD (Coefficient Of Deviation) for different values of y/x. The COD is an index of output variations and is defined as a difference between a maximum output and a minimum output divided by an average output after read/write operations have been performed one million times. FIG. 7 shows that as the value of y/x increases, the COD gets smaller, making the magnetic sensor more stable. Since the magnetic storages using the magnetic sensors with a COD of 10% or smaller have a yield of 95%, it is preferred from FIG. 7 that the value of y/x be set at 1.5 or higher for high-density recording. Further, the yield of magnetic storages using magnetic sensors with a COD of 8% or less is 98%. It is therefore more desirable from FIG. 7 that the value of y/x be set at 1.8 or higher.

The spacer 13 has the second insulating layer 6 and the nonmagnetic layer 10. Where an electrostatic capacity of a capacitor formed by the longitudinal bias layer 1, the insulating layer 5 and the lower shield layer 3 does not pose any problem if the longitudinal bias layer 1 is placed in contact with the upper shield layer 4, the second insulating layer 6 may be omitted without losing the similar effect of this sensor.

Further, the magnetoresistive film 2 may use a GMR structure in addition to the TMR structure. In this case, the TMR film has, for example, a pinned layer 9 of Co—Fe alloy ferromagnetic material, an intermediate layer 8 of Cu, and a free layer 7 of Ni—Fe and Co—Fe alloys.

Embodiment 2

Figure 8:
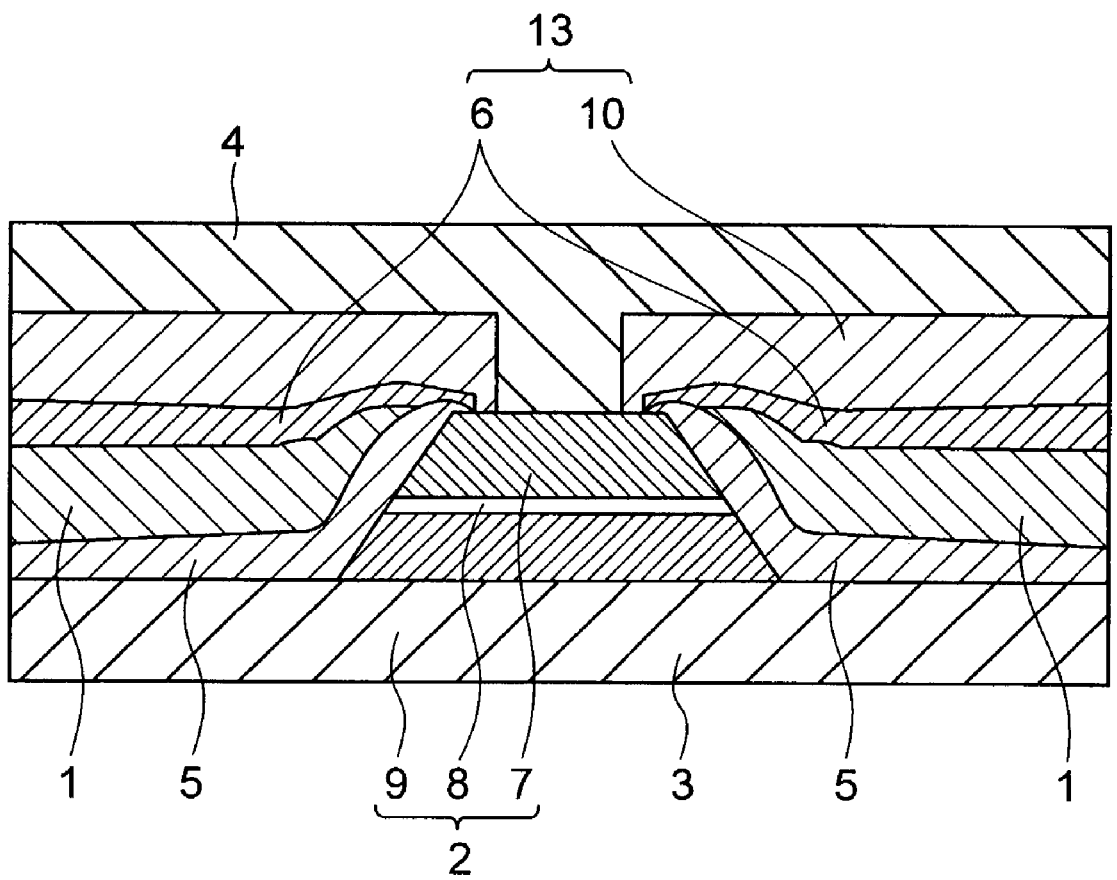
FIG. 8 is a cross-sectional view of a magnetic sensor according to Embodiment 2 of the present invention.

As another embodiment of this invention, a magnetic sensor with a reduced shield-to-shield distance, or a reduced interval between the upper shield layer 4 and the lower shield layer 3 with the magnetoresistive film sandwiched therebetween, can be realized by adopting an ABS (air-bearing surface) structure as shown in FIG. 8. FIG. 9 shows a method of manufacturing this sensor.

Figure 9A:
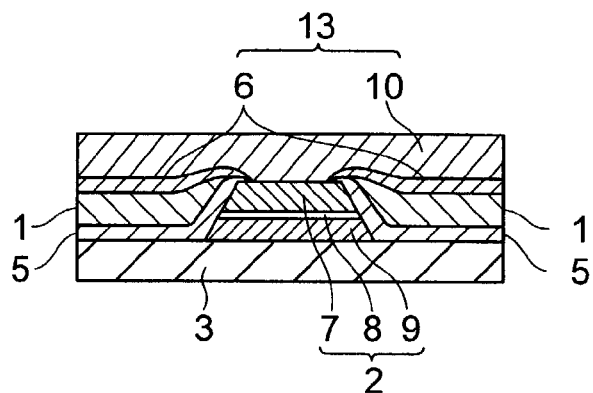
FIGS. 9A to 9D are schematic diagrams showing a method of manufacturing the magnetic sensor of Embodiment 2 of the present invention.

First, by using the method described in Embodiment 1, a structure is formed in which the longitudinal bias layer 1 is arranged at each end of the magnetoresistive film 2 with an insulating layer therebetween. Then, over this structure a nonmagnetic layer 10 is formed by sputtering or ion beam sputtering (FIG. 9A).

Figure 9B:
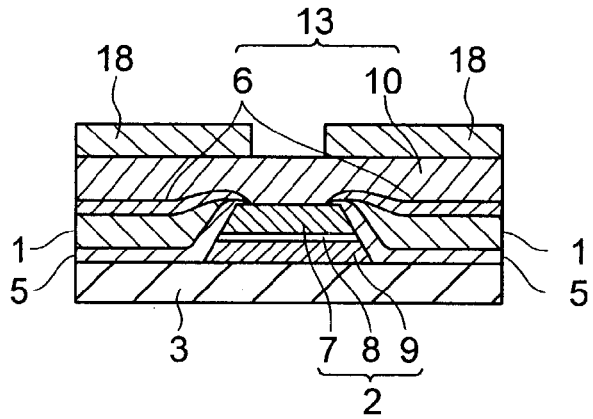

Next, a resist 18 is applied, exposed and developed by a developer to form a pattern as shown in FIG. 9B. Then, with the patterned resist 18 as a mask, the nonmagnetic layer 10 is dry-etched as by ion beam etching and reactive ion etching (RIE) to obtain a patterned nonmagnetic layer 10 as shown in FIG. 9C.

The nonmagnetic layer 10 includes at least a nonmagnetic metal layer of, for example, NiCr and Ru. Next, an upper shield layer 4 of NiFe is formed as by sputtering, ion beam sputtering and plating (FIG. 9D).

Figure 9C:
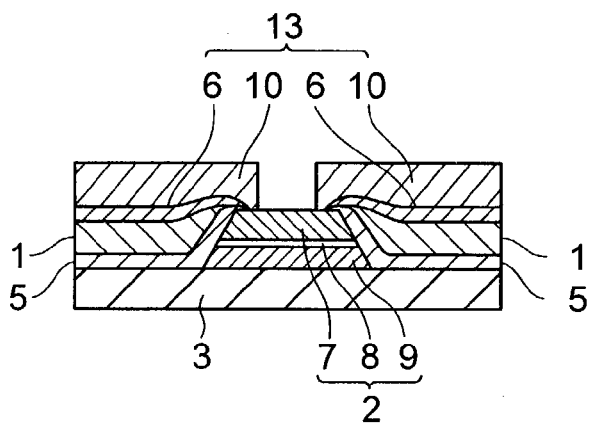
Figure 9D:
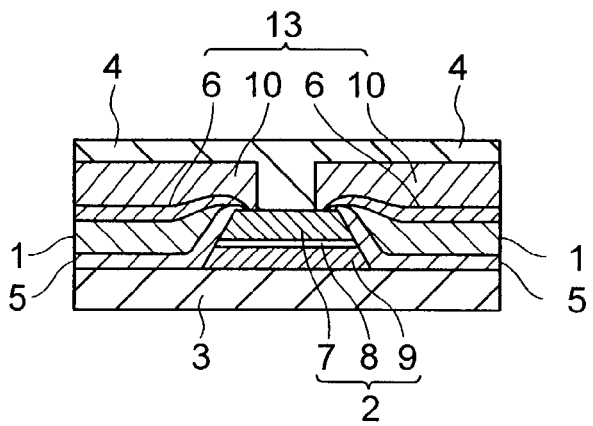

The configuration of FIG. 9C can be obtained by either of the following two methods to realize the structure shown in FIG. 8.

Figure 10:
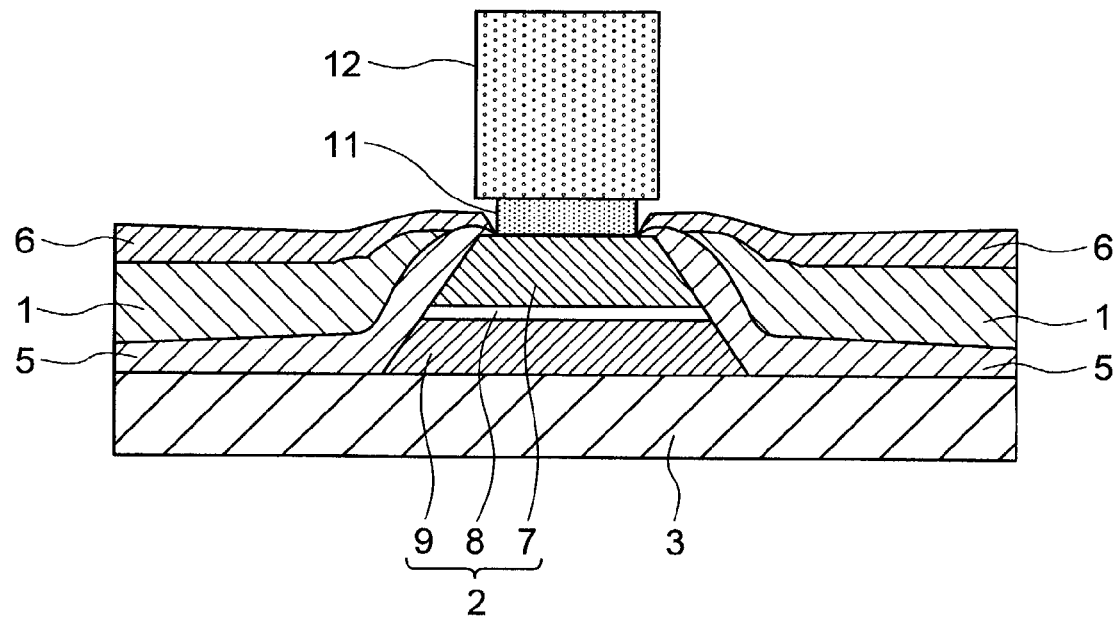
FIG. 10 is a schematic diagram showing one process in the method of manufacturing the magnetic sensor of Embodiment 2 of the present invention.

A first method involves forming a structure in which the longitudinal bias layer 1 is arranged at each end of the magnetoresistive film 2 with an insulating layer interposed therebetween and then performing a lift-off method to obtain the patterned nonmagnetic layer 10 as shown in FIG. 9C. More specifically, a lift-off material made up of the PMGI 11 and the resist 12 is applied, exposed and developed using a developer to be patterned as shown in FIG. 10. Then the nonmagnetic layer 10 is deposited as by sputtering or ion beam sputtering. After this, the lift-off mask comprised of the PMGI 11 and the resist 12 is removed by an organic solvent together with the nonmagnetic layer 10 formed over the lift-off mask, resulting in the structure similar to FIG. 9C.

In another method the insulating layer 5, the longitudinal bias layer 1 and the second insulating layer 6 are successively deposited by sputtering or ion beam sputtering to form a structure in which the longitudinal bias layer 1 is arranged at each end of the magnetoresistive film 2 with the insulating layer therebetween, as in the method used in Embodiment 1. This is followed by the nonmagnetic layer 10 being formed by sputtering or ion beam sputtering and then lifted off to obtain the structure as shown in FIG. 9C.

The spacer 13 is made up of the second insulating layer 6 and the nonmagnetic layer 10. Where an electrostatic capacity of a capacitor formed by the longitudinal bias layer 1, the insulating layer 5 and the lower shield layer 3 does not pose any problem if the longitudinal bias layer 1 is placed in contact with the upper shield layer 4, the second insulating layer 6 may be omitted in the above two methods.

If the interval between the upper shield layer 4 and the lower shield layer 3, between which the magnetoresistive film is sandwiched, is taken as a shield-to-shield distance h, the thickness of the spacer 13 is defined as follows. In a region covering the shield-to-shield distances h added to the magnetoresistive film 2 on each side thereof in the track width direction, the thickness of the thinnest portion of a spacer 13 is denoted y. In this region, the thickness of the thinnest portion of the spacer 13, y, needs to be set equal to or larger than x, the length of the shortest line segment 16 connecting the longitudinal bias layer 1 and the free layer 7 of the magnetoresistive film 2.

In the magnetic sensor fabricated according to this embodiment, the shortest line segment 16 connecting the longitudinal bias layer 1 and the free layer 7 of the magnetoresistive film 2 is found to have a length x of 8 nm and the shortest line segment 17 connecting the longitudinal bias layer 1 and the upper shield layer 4, i.e., the thickness y of the thinnest portion of the spacer 13 in the above-described region, is found to be 14 nm.

Embodiment 3

Figure 11:
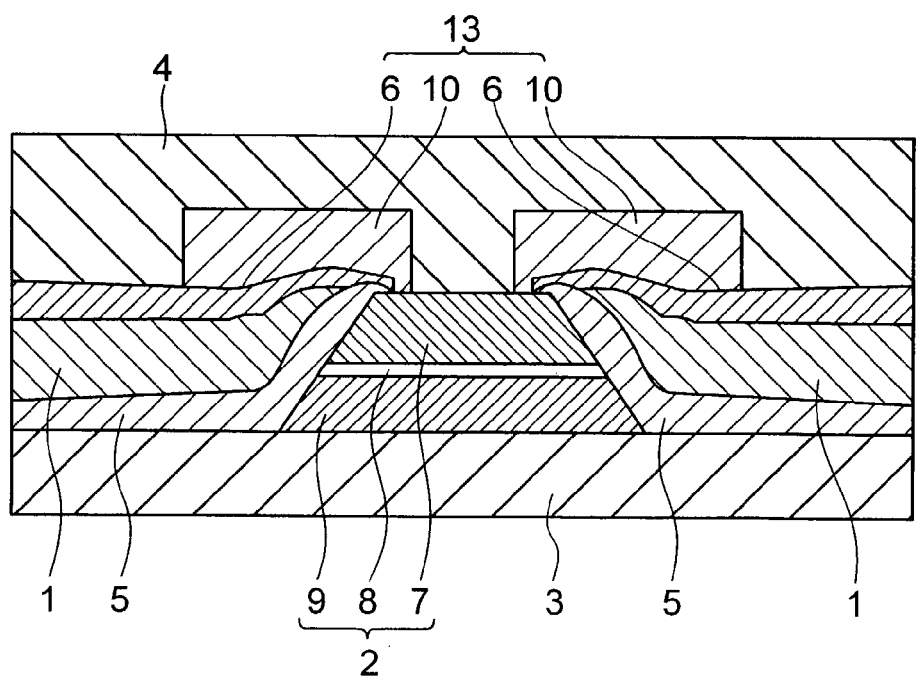
FIG. 11 is a schematic diagram showing a cross-sectional view of a magnetic sensor of Embodiment 3 of the present invention.

A magnetic sensor with a smaller shield-to-shield distance, or a smaller interval between the upper shield layer 4 and the lower shield layer 3 with the magnetoresistive film sandwiched therebetween, than that of the magnetic sensor of Embodiment 2 can be realized by adopting a structure shown in FIG. 11. FIG. 12 shows a method of manufacturing such a structure.

Figure 12A:
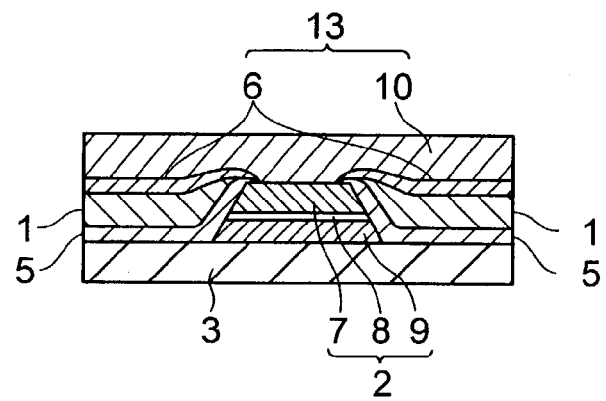
FIGS. 12A to 12D are schematic diagrams showing a method of manufacturing the magnetic sensor of Embodiment 3 of the present invention.

First, using the method shown in Embodiment 1, a structure is formed in which the longitudinal bias layer 1 is disposed at each end of the magnetoresistive film 2 with the insulating layer therebetween and then the nonmagnetic layer 10 is deposited by sputtering or ion beam sputtering (FIG. 12A).

Figure 12B:
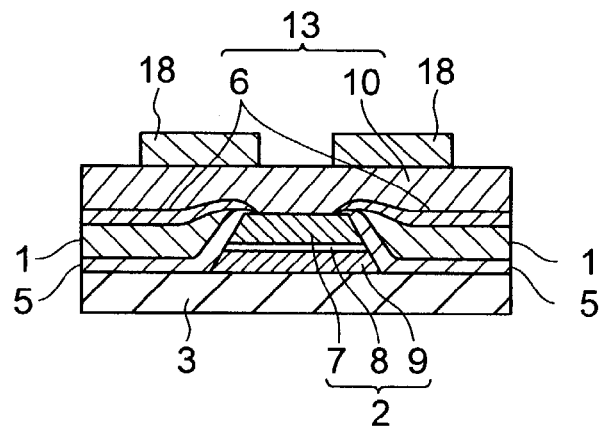
Figure 12C:
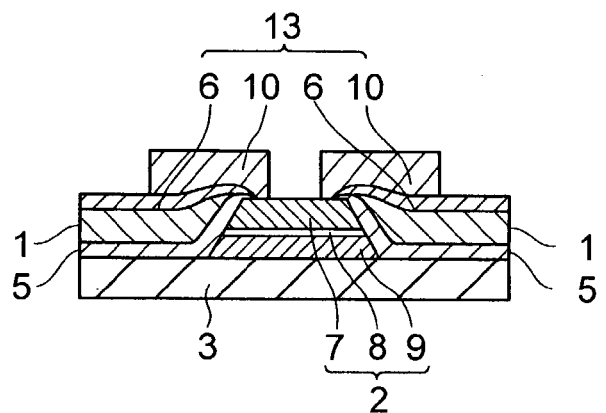

Next, the resist 18 is applied, exposed to light by an aligner or radiated with an electron beam from an electron beam exposure system, and then developed by a developer to form a resist pattern as shown in FIG. 12B. With the patterned resist 18 as a mask, the nonmagnetic layer 10 is subjected to dry etching, such as ion beam etching or reactive ion etching (RIE), to obtain the patterned nonmagnetic layer 10 as shown in FIG. 12C.

Figure 12D:
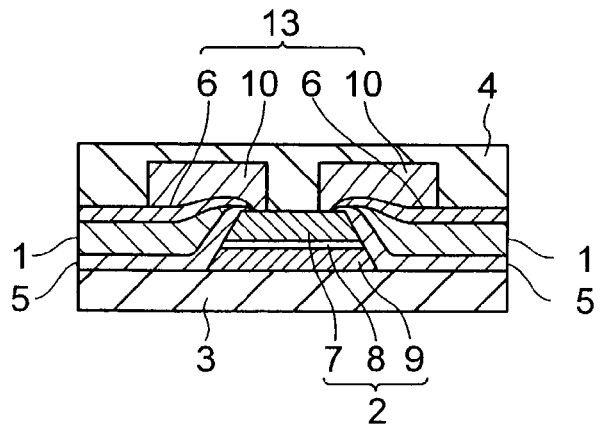

Next, the upper shield layer 4 of Ni—Fe alloy is formed as by sputtering, ion beam sputtering or plating (FIG. 12D). Alternatively, the patterned nonmagnetic layer 10 shown in FIG. 12C may also be obtained by forming a structure having the longitudinal bias layer 1 disposed at each end of the magnetoresistive film 2 with the insulating layer therebetween, applying and patterning a lift-off mask material in a desired geometry, depositing the nonmagnetic layer 10 by sputtering or ion beam sputtering, and lifting off the mask together with the nonmagnetic layer 10.

The spacer 13 is made up of the second insulating layer 6 and the nonmagnetic layer 10. Where an electrostatic capacity of a capacitor formed by the longitudinal bias layer 1, the insulating layer 5 and the lower shield layer 3 does not pose any problem if the longitudinal bias layer 1 is placed in contact with the upper shield layer 4, the second insulating layer 6 may be omitted in the above methods. The nonmagnetic layer 10 includes at least a nonmagnetic metal layer of, for example, NiCr and Ru.

If the interval between the upper shield layer 4 and the lower shield layer 3, between which the magnetoresistive film is sandwiched, is taken as a shield-to-shield distance h, the thickness of the spacer 13 is defined as follows. In a region covering the shield-to-shield distances h added to the magnetoresistive film 2 on each side thereof in the track width direction, the thickness of the thinnest portion of a spacer 13 is denoted y. In this region, the thickness of the thinnest portion of the spacer 13, y, needs to be set equal to or larger than x, the length of the shortest line segment 16 connecting the longitudinal bias layer 1 and the free layer 7 of the magnetoresistive film 2.

In the magnetic sensor manufactured according to this embodiment, the shortest line segment 16 connecting the longitudinal bias layer 1 and the free layer 7 of the magnetoresistive film 2 is found to have a length x of 8 nm and the shortest line segment 17 connecting the longitudinal bias layer 1 and the upper shield layer 4, i.e., the thickness y of the thinnest portion of the spacer 13 in the above-described region, is found to be 13 nm.

With this invention, the insertion of a spacer makes it possible to apply a magnetic field from the longitudinal bias layer to the free layer of the magnetoresistive film without the magnetic field being absorbed by the upper shield layer, thus realizing a highly stable magnetic sensor and magnetic storage.

The present invention includes also the following features.

(1) A method of manufacturing a magnetic sensor, wherein the magnetic sensor comprises a pair of lower and upper shield layers, a magnetoresistive film disposed between the pair of shield layers and having a laminated structure made up of a free layer, an intermediate layer and a pinned layer, and a pair of longitudinal bias layers disposed at both ends of the magnetoresistive film in a track width direction with an insulating layer therebetween and wherein a sensing current is made to flow in a direction of thickness of the magnetoresistive film, the method comprising the steps of:

depositing a lift-off mask material over the magnetoresistive film in forming the magnetoresistive film;

depositing an insulating layer and the longitudinal bias layer on each side of the magnetoresistive film; and after removing the lift-off mask material, depositing a spacer including at least a nonmagnetic metal layer over the longitudinal bias layers.

(2) A method of manufacturing a magnetic sensor, wherein the magnetic sensor comprises a pair of lower and upper shield layers, a magnetoresistive film disposed between the pair of shield layers and having a laminated structure made up of a free layer, an intermediate layer and a pinned layer, and a pair of longitudinal bias layers disposed at both ends of the magnetoresistive film in a track width direction with an insulating layer therebetween and wherein a sensing current is made to flow in a direction of thickness of the magnetoresistive film, the method comprising the steps of:

depositing a lift-off mask material over the magnetoresistive film in forming the magnetoresistive film;

depositing on each side of the magnetoresistive film an insulating layer, the longitudinal bias layer and a spacer including at least a nonmagnetic metal layer; and removing the lift-off mask material.

(3) A method of manufacturing a magnetic sensor, wherein the magnetic sensor comprises a pair of lower and upper shield layers, a magnetoresistive film disposed between the pair of shield layers and having a laminated structure made up of a free layer, an intermediate layer and a pinned layer, and a pair of longitudinal bias layers disposed at both ends of the magnetoresistive film in a track width direction with an insulating layer therebetween and wherein a sensing current is made to flow in a direction of thickness of the magnetoresistive film, the method comprising the steps of:
depositing the magnetoresistive film and, on each side of the magnetoresistive film, an insulating layer and the longitudinal bias layer; and
depositing over the longitudinal bias layers and the magnetoresistive film a spacer including at least a nonmagnetic metal layer (4) A magnetic storage also comprising:
a magnetic recording medium for recording information;
a magnetic read/write head having a writing element for recording information on the magnetic recording medium, a reading element for detecting information recorded on the magnetic recording medium;
a read/write circuit for sending and receiving a write signal and a read signal to and from the magnetic read/write head;
an actuator for moving the read/write head to a predetermined position on the magnetic recording medium; and
a means for controlling a read/write operation to control the read/write circuit and the actuator.

(5) A magnetic storage according to (4), wherein a linear density is 700 kBPI or higher.

(6) A magnetic storage according to (4), wherein an a real density is 70 Gb/in$^2$ or higher.

(7) A magnetic storage according to (4), wherein the recording media is a perpendicular recording media and the writing element uses a perpendicular recording system.

It should be further understood by those skilled in the art that although the foregoing description has been made on embodiments of the invention, the invention is not limited thereto and various changes and modifications may be made without departing from the spirit of the invention and the scope of the appended claims.

What is claimed is:
1. A magnetic sensor comprising:
a pair of lower and upper shield layers, which also act as a pair of electrodes;
a magnetoresistive film disposed between the pair of shield layers which is including a free layer, an intermediate layer and a pinned layer;
a pair of longitudinal bias layers disposed at both ends of the magnetoresistive film in a track width direction;
a pair of insulation layers disposed between the pair of longitudinal bias layers and the both ends of the magnetoresistive film in a track width direction; and
a spacer including at least a nonmagnetic metal layer is disposed between the upper shield layer and the pair of longitudinal bias layers, and between the upper shield layer and the magnetoresistive film,
wherein a shortest distance between the longitudinal bias layers and the free layer of the magnetoresistive film is smaller than a shortest distance between the longitudinal bias layers and the upper shield layer.

2. A magnetic sensor according to claim 1, wherein if a distance between the upper shield layer and the lower shield layer, between which the magnetoresistive film is sandwiched, is taken as a shield-to-shield distance, in a region covering the shield-to-shield distances added to the magnetoresistive film on each side thereof in the track width direction the shortest distance between the longitudinal bias layers and the free layer of the magnetoresistive film is smaller than the shortest distance between the longitudinal bias layers and the upper shield layer.

3. A magnetic sensor according to claim 1, wherein if a distance between the upper shield layer and the lower shield layer, between which the magnetoresistive film is sandwiched, is taken as a shield-to-shield distance, in a region covering the shield-to-shield distances added to the magnetoresistive film on each side thereof in the track width direction a thickness of the spacer is larger than that of a thinnest portion of the pair of insulating layers disposed between the longitudinal bias layers and the free layer of the magnetoresistive film.

4. A magnetic sensor according to claim 1, wherein the shortest distance in the track width direction between the longitudinal bias layers and the free layer of the magnetoresistive film is smaller than the shortest distance between the longitudinal bias layers and the upper shield layer in a direction perpendicular to the track width direction.

5. A magnetic sensor according to claim 1, wherein the shortest distance between the longitudinal bias layers and the upper shield layer is 1.5 or more times the shortest distance in the track width direction between the longitudinal bias layers and the free layer of the magnetoresistive film.

6. A magnetic sensor according to claim 1, wherein the shortest distance between the longitudinal bias layers and the upper shield layer is 1.8 or more times the shortest distance in the track width direction between the longitudinal bias layers and the free layer of the magnetoresistive film.

7. A magnetic sensor comprising:
a pair of lower and upper shield layers;
a magnetoresistive film disposed between the pair of shield layers and having a laminated structure made up of a free layer, an intermediate layer and a pinned layer; and
a pair of longitudinal bias layers disposed at both ends of the magnetoresistive film in a track width direction;
wherein a sensing current is made to flow in a direction of thickness of the magnetoresistive film, a spacer including at least a nonmagnetic metal layer is disposed between the upper shield layer and the longitudinal bias layers, and a shortest distance between the longitudinal bias layers and the free layer of the magnetoresistive film is smaller than a shortest distance between the longitudinal bias layers and the upper shield layer;
wherein the intermediate layer of the magnetoresistive film is a tunneling barrier layer and a resistivity of the nonmagnetic metal layer forming the spacer is 200 μΩ·cm or less.

8. A magnetic sensor according to claim 1, wherein the nonmagnetic metal layer is formed of a metal of at least one element selected from a group of Cr, Mo, Ta, Ti, Ni, Nb and W.

9. A magnetic sensor comprising:
a pair of lower and upper shield layers;
a magnetoresistive film disposed between the pair of shield layers and having a laminated structure made up of a free layer, an intermediate layer and a pinned layer; and
a pair of longitudinal bias layers disposed at both ends of the magnetoresistive film in a track width direction;
wherein a sensing current is made to flow in a direction of thickness of the magnetoresistive film, a spacer including at least a nonmagnetic metal layer is disposed between the upper shield layer and the longitudinal bias layers, and a shortest distance between the longitudinal bias layers and the free layer of the magnetoresistive film is smaller than a shortest distance between the longitudinal bias layers and the upper shield layer;

wherein the intermediate layer of the magnetoresistive film is a conductive layer and a resistivity of the nonmagnetic metal layer forming the spacer is 100 μΩ·cm or less.

10. A magnetic sensor according to claim 9, wherein the nonmagnetic metal layer is formed of a metal of at least one element selected from a group of Cr, Mo, Ta, Ti, Ni, Nb, Au, Cu, Ag, Al, Rh and W.

* * * * *